(12) United States Patent
Lee et al.

(10) Patent No.: US 6,190,725 B1
(45) Date of Patent: Feb. 20, 2001

(54) COATING METHOD FOR THE PREPARATION OF COATED NUCLEAR FUELS WITH CARBIDES BORIDES OR NITRIDES BY USING HIGH TEMPERATURE AND HIGH PRESSURE COMBUSTION SYNTHESIS

(75) Inventors: Young Woo Lee; Bong Goo Kim; Jung Won Lee; Sang Ho Na; Dong Sung Sohn; Yong Choi, all of Taejon Si (KR)

(73) Assignees: Korea Atomic Energy Research Institute, Taejon-si; Korea Electric Power Corporation, Seoul, both of (KR)

(*) Notice: Under 35 U.S.C. 154(b), the term of this patent shall be extended for 0 days.

(21) Appl. No.: 09/140,691

(22) Filed: Aug. 26, 1998

Related U.S. Application Data

(63) Continuation-in-part of application No. 09/120,149, filed on Jul. 21, 1998, now abandoned.

(30) Foreign Application Priority Data

Dec. 2, 1997 (KR) .................................................. 97-65414

(51) Int. Cl.[7] .............................. G21C 3/06; C23C 16/00; B05D 7/00
(52) U.S. Cl. ........................... 427/6; 427/249; 427/255.7; 427/215; 427/590
(58) Field of Search ................................... 427/5, 6, 249, 427/249.19, 255.7, 255.15, 255.18, 255.38, 255.394, 214, 215, 590

(56) References Cited

U.S. PATENT DOCUMENTS

| | | | |
|---|---|---|---|
| 4,212,898 | * 7/1980 | Hrovat et al. | ............................. 427/6 |
| 4,363,828 | * 12/1982 | Brodsky et al. | ........................ 427/39 |
| 4,459,338 | * 7/1984 | Angelini et al. | ...................... 428/404 |
| 4,810,526 | 3/1989 | Ito et al. . | |
| 4,963,758 | * 10/1990 | Noren et al. | ........................... 264/0.5 |
| 5,498,442 | * 3/1996 | Lennartz | ................................... 427/6 |

OTHER PUBLICATIONS

Pierson, Hugh O., Handbook of Chemical Vapor Deposition (CVD): Principles, Technology and Applications, 1992.*

* cited by examiner

*Primary Examiner*—Shrive Beck
*Assistant Examiner*—Jennifer Kolb
(74) *Attorney, Agent, or Firm*—Dilworth & Barrese

(57) ABSTRACT

The present invention relates to a coating method for the preparation of a coated nuclear fuel. Particularly, the present invention relates to the coating method of nuclear fuel surface with more than two coated layers of carbides, borides or nitrides and their compounds comprising deposition or permeation steps of i) elements or mixture that can form carbides, borides or nitrides and ii) a layer of pyrolytic carbon or boron prepared by chemical vapor deposition (CVD) or sputtering in sequence or in reverse sequence, or nitrogen prepared by gas permeation in sequence, on the nuclear fuel surface. The coated layers are formed with carbides, borides, nitrides or their mixture at high temperature and pressure by a combustion synthesis. The coating method of this invention can be applied to various types of nuclear fuels either in particle or in pellet type and control and preserve fine crystal structure without phase transition since the surface of nuclear fuel coated with pyrolytic carbon and silicon is heated only for several seconds by heat source such as laser beam, arc or microwave. Thus, the present invention is excellent method of coating nuclear fuel surface not only for particle type fuel which used in High Temperature Gas-cooled Reactor (HTGR) but also for pellet type fuel used for Water-cooled Reactors.

11 Claims, 5 Drawing Sheets

COATING METHOD FOR THE PREPARATION OF COATED NUCLEAR FUELS WITH CARBIDES BORIDES OR NITRIDES BY USING HIGH TEMPERATURE AND HIGH PRESSURE COMBUSTION SYNTHESIS

This is a continuation-in-part of application Ser. No. 09/120,149 filed Jul. 21, 1998 now abandoned.

BACKGROUND OF THE INVENTION

The present invention relates to a coating method for the preparation of coated nuclear fuel. Particularly, the present invention relates to the coating method of nuclear fuel surface with more than two coated layers of carbides, borides or nitrides, comprising steps of depositing or permeating i) elements or compounds that can form carbides, borides or nitrides by reacting with pyrolytic carbon, boron or nitrogen and ii) a layer of pyrolytic carbon or boron prepared by chemical vapor deposition(CVD) or sputtering in sequence or in reverse sequence, or nitrogen prepared by gas permeation in sequence, on the nuclear fuel surface. The coated layers are formed with carbides, borides, nitrides or their mixtures at high temperature and pressure by combustion synthesis.

Various types of nuclear power plants have been developed in different concepts such as High Temperature Gascooled Reactor (HTGR), Pressurized Light Water Reactor (PLWR) and Pressurized Heavy Water Reactor (PHWR). Nuclear fuels used in the nuclear power plants depend on such reactor types. For example, spherical shape nuclear fuels are used for High Temperature Gas-cooled Reactor (HTGR) and cylindrical pellet type nuclear fuels are normally used in Water-cooled Reactors which are the most popular nuclear power plants in operation worldwide.

In order to secure the safety of high temperature gascooled reactor, deposition of graphite and carbide on the nuclear fuel kernel was applied to avoid fission gas release. The coated layers were prepared on the surface of spherical nuclear fuel kernel with a thickness of hundreds micron ($\mu$m). For this preparation, the coating on spherical nuclear fuels(UCO, $ThO_2$) was carried out with a mixture of methylchlorosilane and ethylene gases in a fluidized bed type chamber by a chemical vapor deposition method (FBT CVD): pyrolytic carbon and silicon carbide layers are formed at high temperatures of about 1200° C. and 1600° C., respectively. The problems of these methods are the occurrence of microstructural defects due to relatively high temperature employed and the formation of hazardous by-products such as hydrochloric acid and chlorine gas due to the thermal decomposition of silane compounds such as methylchlorosilane, dimethylchlorosilane and triethylchlorosilane.

Meanwhile, in water-cooled reactors, used is relatively large-sized pellet type nuclear fuel in cylindrical shape, whose dimension varies from 7 to 12 mm in diameter and from 10 to 15 mm in height with dish-shaped grooves in its upper and lower faces. Coating of carbides, borides or nitrides on this pellet type nuclear fuel can be thought to effectively reduce the fission gas release, particularly in high-burnup fuel. Coated pellet type nuclear fuel has never been used and the coating method for this type fuel has not been yet envisaged. Furthermore, conventional FBT CVD method can not be applied to pellet type nuclear fuel which has anisotropic shape and is relatively larger and heavier than spherical type nuclear fuel.

The present inventors have found a coating method for nuclear fuel surface with more than two coated layers of carbides, borides, nitrides or their mixture comprising deposition or permeation steps of i) elements or compounds that can form carbides, borides or nitrides by reacting with pyrolytic carbon, boron or nitrogen and ii) a layer of pyrolytic carbon or boron prepared by chemical vapor deposition(CVD) or sputtering in sequence or in reverse sequence, or nitrogen prepared by gas permeation in sequence, on the nuclear fuel surface. The coated layers are formed with carbides, borides, nitrides or their mixture at high temperature and pressure by combustion synthesis.

SUMMARY OF THE INVENTION

The objective of the present invention is to provide a coating method for the preparation of a coated nuclear fuel with multi-coated layers of pyrolytic carbon or boron; and carbides, borides, nitrides or their mixture in sequence or in reverse sequence.

DETAILED DESCRIPTION OF THE INVENTION

Figure 1:
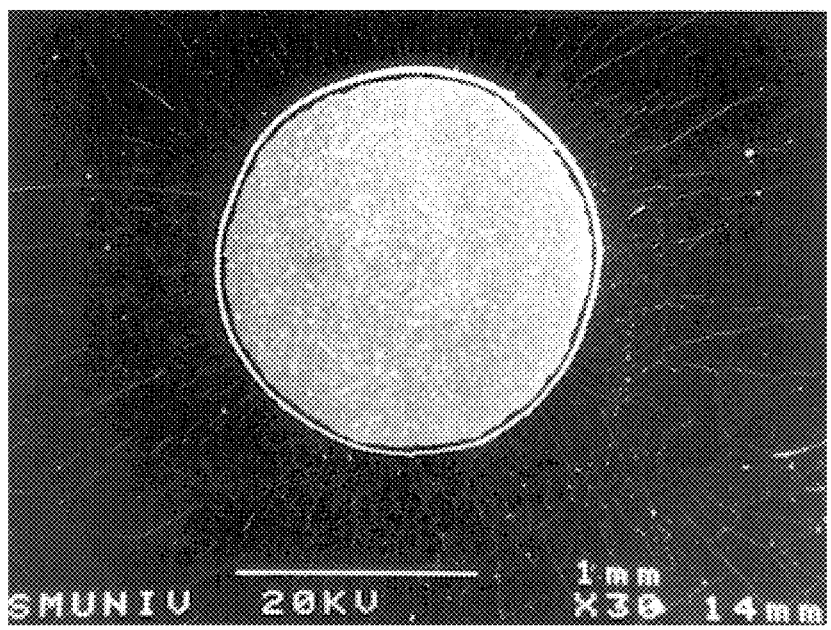
FIG. 1 is a SEM micrograph of the cross section of nuclear fuel coated with pyrolytic carbon.

In order to attain the objective of this invention, the present invention provides the coating method for nuclear fuel surface with more than two layers of carbides, borides, nitrides or their mixture comprising deposition or permeation steps of i) elements or compounds that can form carbides, borides or nitrides by reacting with pyrolytic carbon, boron or nitrogen; and ii) a layer of pyrolytic carbon or boron prepared by chemical vapor deposition (CVD) or sputtering in sequence or in reverse sequence, or nitrogen prepared by gas permeation in sequence, on the nuclear fuel surface. The coated layers are formed with carbides, borides, nitrides or their mixture at high temperature and pressure by combustion synthesis.

Hereinafter, the coating method of nuclear fuel surface of this invention, comprising two steps, is explained in detail:

Step of depositing or permeating compound layers on the nuclear fuel surface (Step I); and step of reacting the compound layers formed in Step I at a high temperature and pressure by a combustion synthesis (Step II).

First, i) elements or compounds that can form carbides, borides or nitrides by reacting with pyrolytic carbon, boron or nitrogen and ii) a layer of pyrolytic carbon or boron are separately deposited on the surface of nuclear fuel by CVD, gas permeation or sputtering (Step I).

The pyrolytic carbon source is hydrocarbon compound such as methane($CH_4$), acetylene ($C_2H_2$), ethylene($C_2H_4$) or propane ($C_3H_8$); the boron source is boron(B), boron oxide ($B_2O_3$) or metal-boron compounds(MoB, $MoB_2$, $ZrB_2$, etc.); and the nitrogen source is nitrogen gas.

Elements or compounds that can form carbides, borides or nitrides by reacting with pyrolytic carbon, boron or nitrogen is selected from the group comprising silicon(Si), zirconium (Zr), boron, or their compounds.

The silicon compound is chemical reagent decomposed at low temperature(200~300° C.) such as silane($SiH_4$), tetramethylsilane (($CH_3)_4Si$) or hexamethylsilane ($C_6H_{18}Si_2$); the zirconium compound is zirconium oxide($ZrO_2$) or zirconium chloride($ZrCl_4$); and the boron compound is boron carbide ($B_4C$) or boron nitride (BN).

The above-mentioned compounds are characterized by depositing and permeating at relatively low temperature compared with the conventional methods, the compounds are deposited or permeated on the surface of nuclear fuel at 500~1200° C. controlling the surrounding pressure of $10^{-5}$~1 atm.

The aforementioned compounds are coated on the nuclear fuel with separate devices: A modified fluidized bed type chemical vapor deposition(FBT CVD) device or plasma-enhanced chemical vapor deposition(PE CVD) device is preferably used as deposition device which prepares pyrolytic carbon or boron; and silicon, zirconium or boron layers on the nuclear fuel surface. PECVD device is more preferable in silicon deposition.

Next, the aforementioned compound layers on the coated surface of nuclear fuel are irradiated by a heat source such as laser beam, arc or microwave instantaneously for a short time, and high temperature combustion synthesis reaction occurs between i) elements or compounds that can form carbides, borides or nitrides by reacting with pyrolytic carbon, boron or nitrogen and ii) a layer of pyrolytic carbon or boron(Step II). High temperature(1700~4000° C.) heating in this step II is carried out by using a heat source such as laser beam, arc or microwave for 1~2 seconds, controlling the surrounding prssure of $10^{-3}$~$10^{-2}$ atm.

Pyrolytic carbon or boron layer; and carbide, boride or nitride layer are formed on the surface of nuclear fuel as a result of step II. That is, i) elements or compounds that can form carbides, borides or nitrides by reacting with pyrolytic carbon, boron or nitrogen and ii) a layer of pyrolytic carbon or boron in the coated layers on the surface of nuclear fuel are co-diffused through combustion reaction, then a carbide, boride or nitride layer is formed at outer part of the surface of nuclear fuel and an unreacted pyrolytic carbon or boron remains in inner part. For example, silicon carbide, zirconium carbide or boron carbide layer is formed at outer part of the surface of nuclear fuel respectively, and pyrolytic carbon remains in inner part when i) silicon, zirconium, boron, or each of their compounds is reacted with ii) pyrolytic carbon.

Thickness of carbide, boride or nitride layer is controlled from several microns to hundreds of microns by the extent of combustion reaction.

Besides above process, heat treatment of nuclear fuel coated with pyrolytic carbon or boron; and silicon, zirconium, boron, or each of their compounds prepared by various CVD devices is carried out in a reduction furnace or in high temperature of nitrogen atmosphere to obtain the formation of pyrolytic carbon or boron layer; and carbide, boride or nitride layer.

Hereinafter, the invention has been illustrated for reference by giving specific examples. The following examples are only for showing the application of the present invention, but the claim of the present invention is not limited within these examples.

EXAMPLE 1

Figure 2:
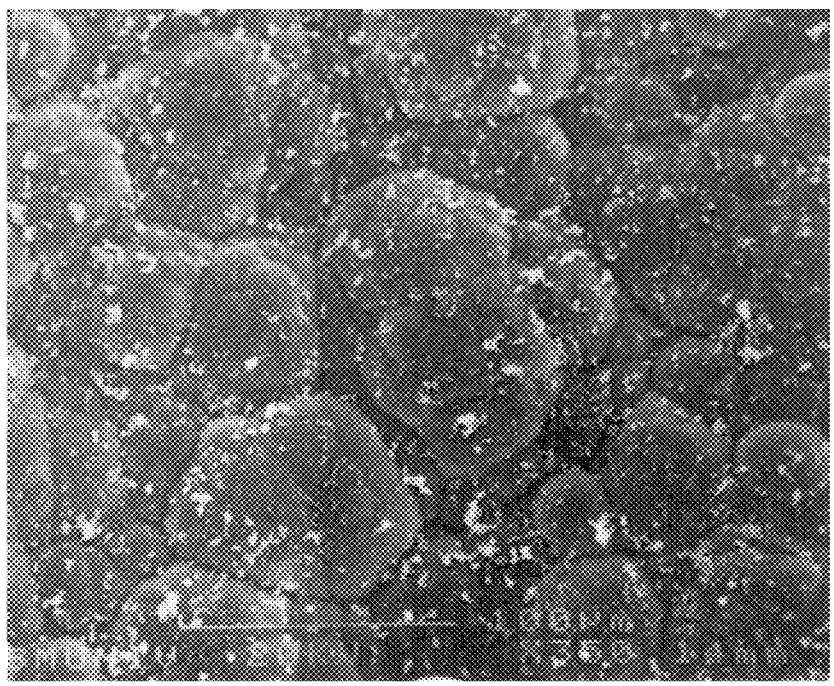
FIG. 2 is a SEM micrograph of pyrolytic carbon layer which is outer layer of nuclear fuel particle.
Figure 3:
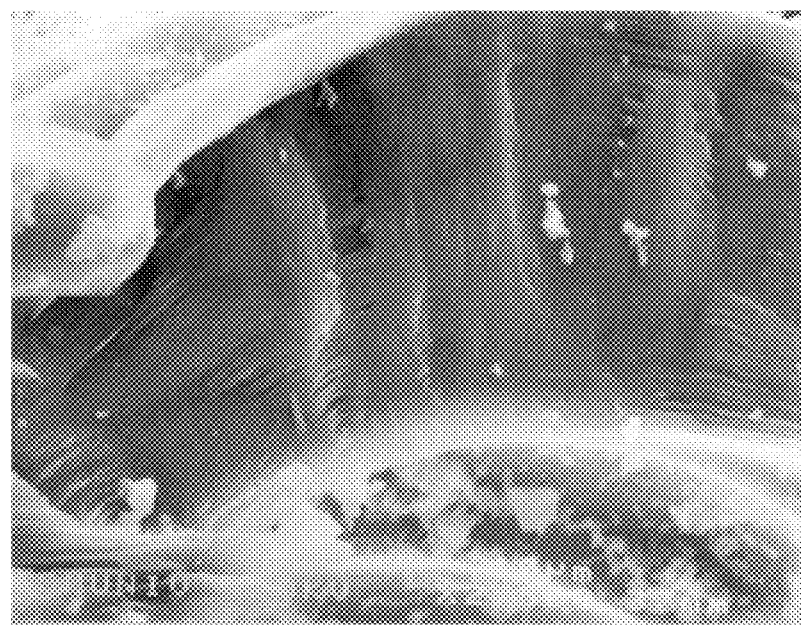
FIG. 3 is a highly magnified SEM micrograph of the pyrolytic carbon layer coated on a nuclear fuel particle.

Pyrolytic carbon formed by thermal decomposition of high-purity propane as a carbon source is deposited on the free surface of nuclear fuel by FBT CVD device, at 1200° C. and 1 atm. FIG. 1 shows the cross sectional view of particle type nuclear fuel coated with pyrolytic carbon; light layer is observed around the particle. FIG. 2 is magnified view of the surface of the pyrolytic carbon layer in FIG. 1, and FIG. 3 shows the cross sectional view of this pyrolytic carbon layer. It is verified that pyrolytic carbon layer is formed in the first half of the step I from these figures (FIGS. 1~3).

Next, silicon, that can form carbide by reacting with pyrolytic carbon, formed by the decomposition of high-purity silane($SiH_4$), is deposited on the carbon coated surface of the fuel by PE CVD device, at 500° C. and $10^{-5}$ atm.

Figure 4A:
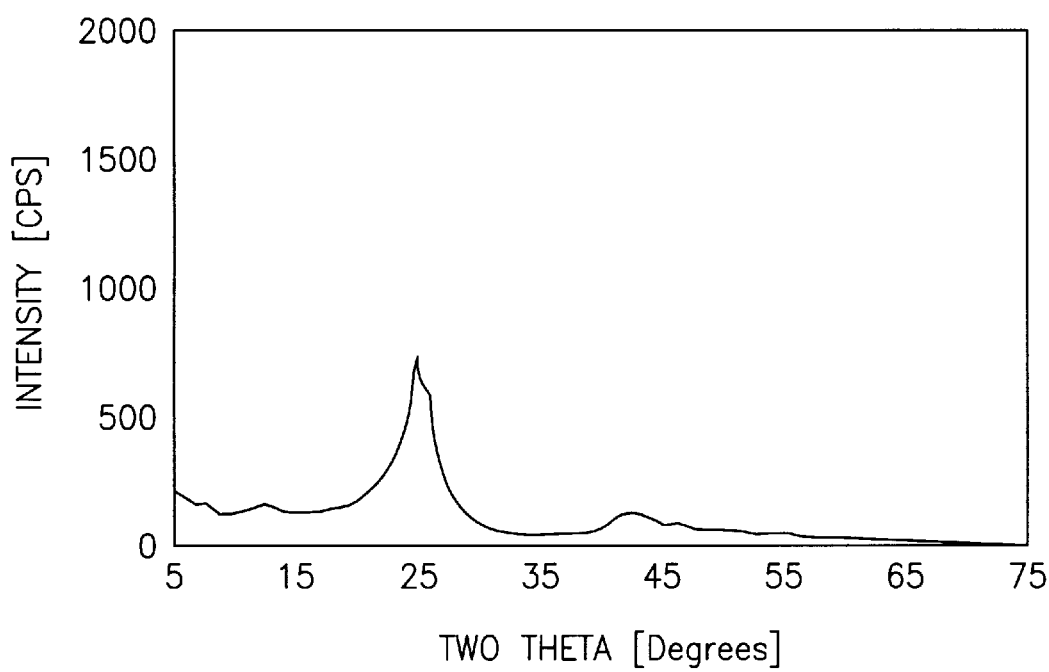
FIG. 4a is X-ray diffraction spectra of upper silicon layer before combustion reaction.
Figure 4B:
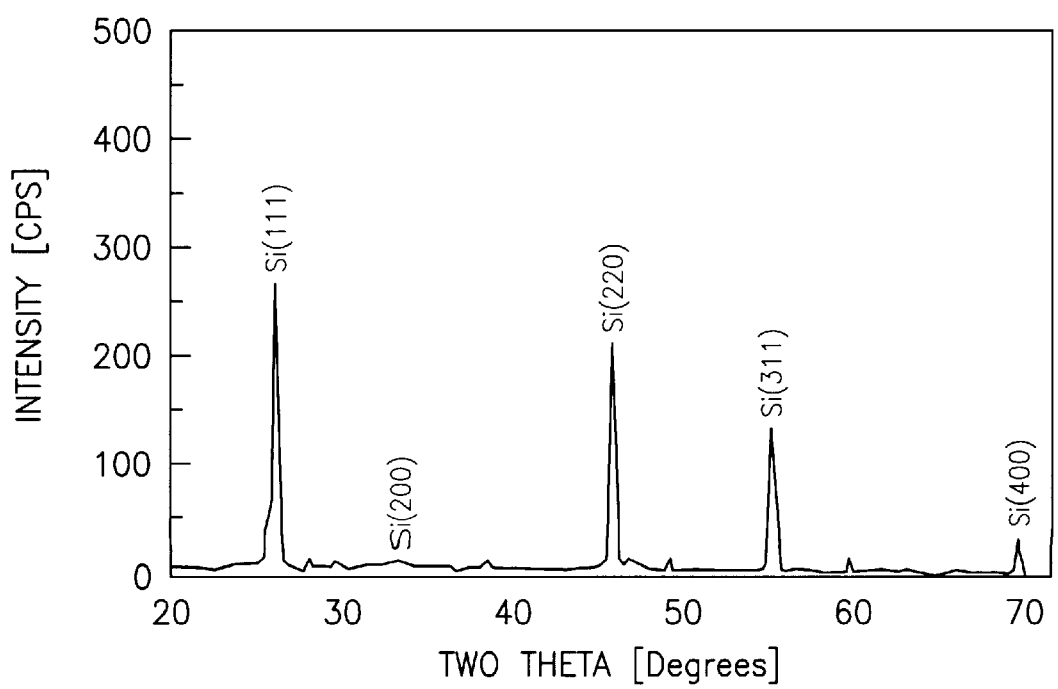
FIG. 4b is X-ray diffraction spectra of lower pyrolytic carbon layer before combustion reaction.

The resultant coated layer comprises pyrolytic carbon sub-layer in inner part and silicon sub-layer in outer part as shown in X-ray diffraction spectra in FIG. 4a and FIG. 4b.

Figure 5A:
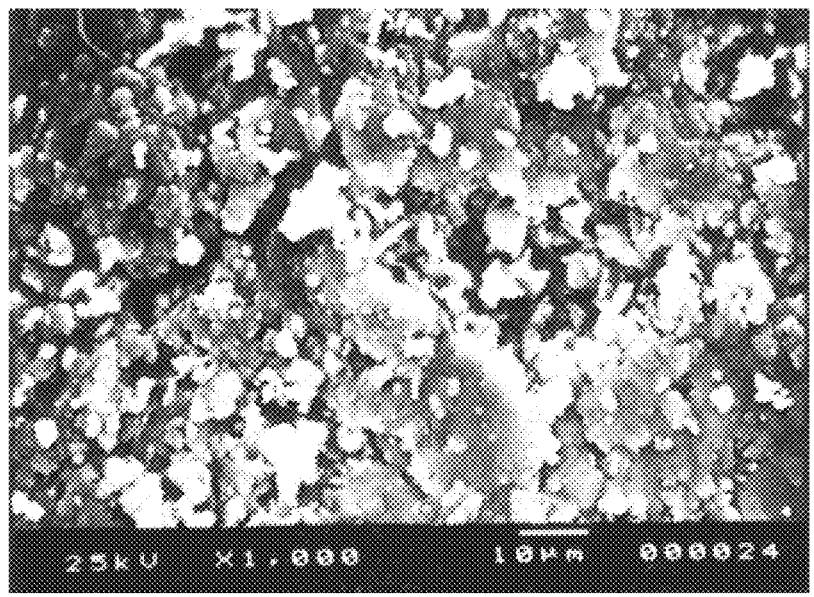
FIG. 5a is a SEM micrograph of the nuclear fuel surface coated with pyrolytic carbon and silicon before combustion reaction.
Figure 5B:
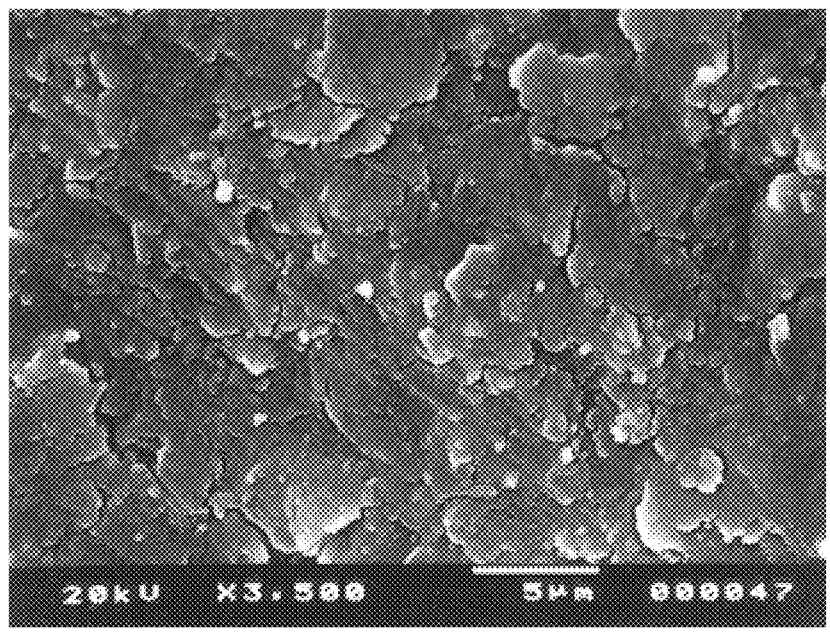
FIG. 5b is a SEM micrograph of the nuclear fuel surface coated with pyrolytic carbon and silicon after combustion reaction.
Figure 6:
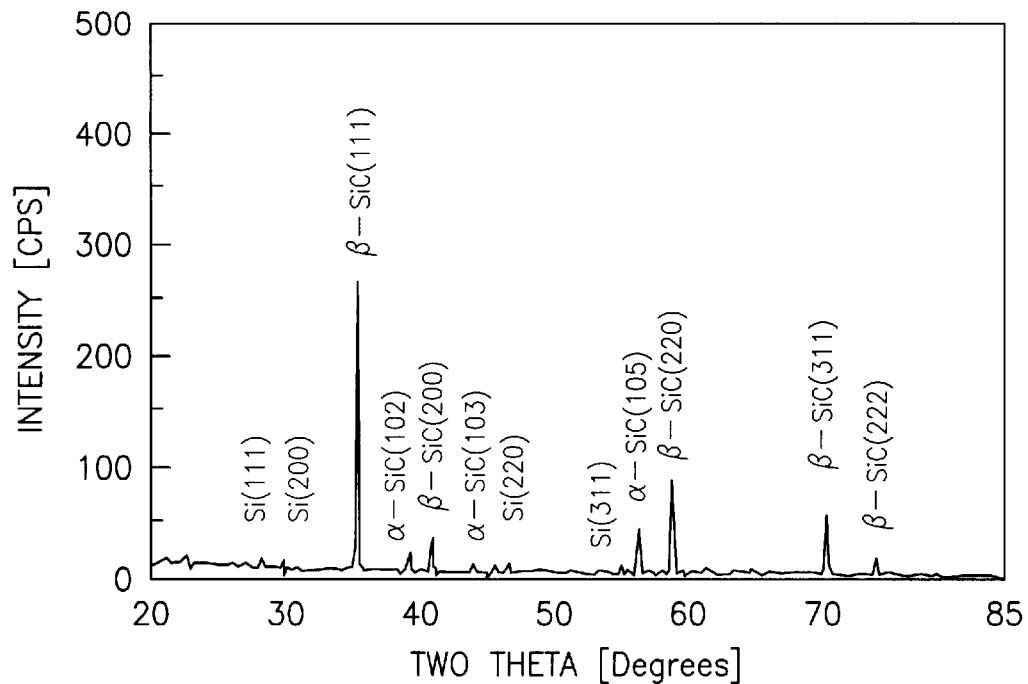
FIG. 6 is X-ray diffraction spectra of silicon carbide layer after combustion reaction.

The above resultant coated layer was then heated for 1~2 seconds at a pressure of $10^{-3}$ atm by using high temperature (1700° C.) arc and cooled. As a result, coarse surface of silicon coated layer before high temperature treatment becomes dense surface of silicon carbide layer after high temperature treatment as shown in FIG. 5a and FIG. 5b. This dense surface layer contains silicon carbide as a major component and a very small amount of silicon, as shown in X-ray diffraction spectra in FIG. 6.

Figure 7:
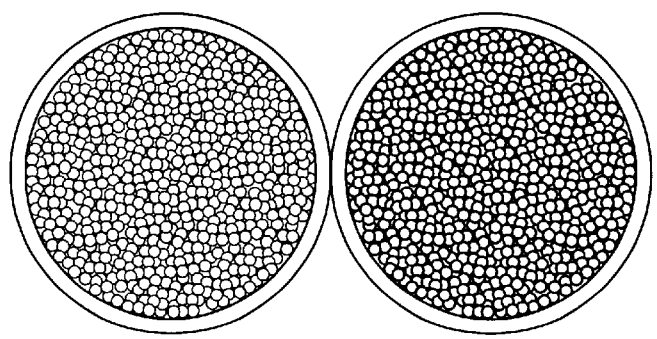
FIG. 7 is a photograph of particle type nuclear fuel before and after carbide coating.

In FIG. 7, white particles represent dummy nuclear fuel particles before carbide coating, black particles represent coated dummy nuclear fuel particles after carbide coating.

It can be concluded from the above SEM micographs and X-ray diffraction spectra that deposited structure, pyrolytic carbon in inner layer and silicon carbide in outer layer, was formed at the surface of dummy nuclear fuel particle.

The silicon carbide layer includes more than 99% of β-silicon carbide (β-SiC) with small amount of impurities such as α-silicon carbide($\leq 0.5\%$), silicon oxide($\leq 0.3\%$) or silicon($\leq 0.2\%$). The hardness and density of the silicon carbide (SiC) layer were measured by using Vickers hardness tester and water immersion method, respectively. As a result, the hardness is higher than 30 GPa and the density is higher than 2.6 g/cm³.

EXAMPLE 2

Using the same raw materials and devices as the above example 1 except for low grade industrial propane instead of high-purity propane, coated layers of pyrolytic carbon and silicon were deposited on the free surface of dummy nuclear fuel particle in sequence, the deposited layers were then heated in a reduction furnace for 1 hour at 1500° C. and $10^{-3}$ atm and cooled to room temperature. Resultant coated layer also comprises pyrolytic carbon sub-layer in inner part and silicon carbide sub-layer in outer part.

The silicon carbide layer includes more than 99% of β-silicon carbide(β-SiC) with small amount of impurities such as α-silicon carbide($\leq 0.5\%$), silicon oxide($\leq 0.3\%$) or silicon($\leq 0.2\%$). The hardness of the silicon carbide (SiC) layer is measured higher than 30 GPa and the density of the silicon carbide is measured higher than 2.6 g/cm$^3$.

EXAMPLE 3

Using the same raw materials and devices as the above example 1 except for dummy nuclear fuel pellet instead of particle type nuclear fuel, coated layers of pyrolytic carbon and silicon were deposited on the free surface of dummy nuclear fuel pellet in sequence. The deposited layers were then heated in a reduction furnace for 1 hour at 1500° C. and $10^{-3}$ atm and cooled to room temperature. Resultant coated layer also comprises pyrolytic carbon sub-layer in inner part and silicon carbide sub-layer in outer part.

Figure 8:
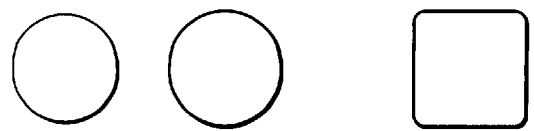
FIG. 8 is a photograph of pellet type nuclear fuel before and after carbide coating.

Lighter cylinder in the left of FIG. 8, represents dummy nuclear fuel pellet before carbide coating, the other two represent dummy nuclear fuel pellet after carbide coating.

Figure 9:
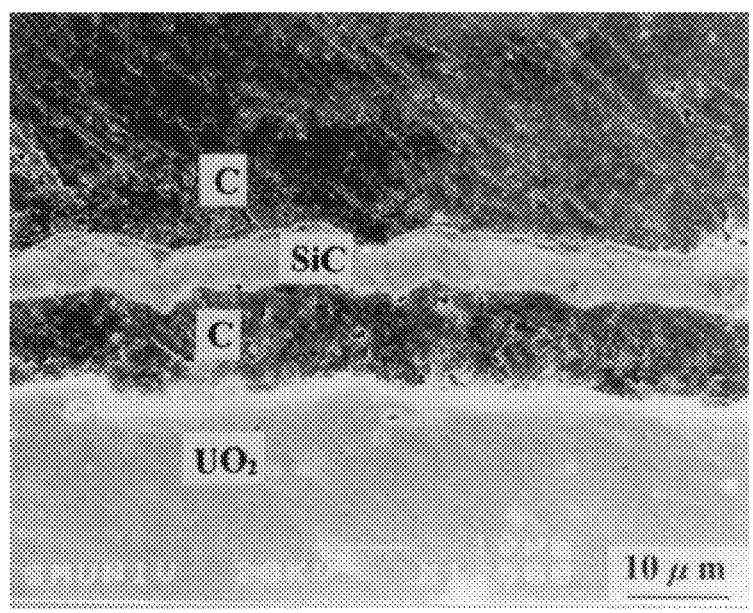
FIG. 9 is a SEM micrograph of the cross section of $UO_2$ pellet type nuclear fuel coated with pyrolytic carbon, silicon carbide and pyrolytic carbon.

Additionally, pyrolytic carbon and silicon were deposited on the free surface of UO$_2$ nuclear fuel pellet, followed by heating for 1~2 seconds at $10^{-3}$ atm by using high temperature arc($\geq 1700°$ C.) and cooled. Then pyrolytic carbon was deposited on the coated layer above by the same method as example 1. FIG. 9 shows the cross sectional view of these layers, revealing that, in this case, the deposited structure, pyrolytic carbon in inner and outer layers and silicon carbide between the two pyrolytic carbon.

The silicon carbide layer includes more than 99% of β-silicon carbide(β-SiC) with small amount of impurities such as α-silicon carbide($\leq 0.5\%$), silicon oxide($\leq 0.3\%$) or silicon($\leq 0.2\%$). The hardness of the silicon carbide (SiC) layer is measured higher than 30 GPa and the density of the silicon carbide is measured higher than 2.6 g/cm$^3$.

Following table 1 represents the raw materials used and the properties of resultant coated layer.

TABLE 1

| | EXAMPLE 1 | EXAMPLE 2 | EXAMPLE 3 |
|---|---|---|---|
| Step I | | | |
| raw material | | | |
| nuclear fuel | particle type | particle type | pellet type |
| carbon source | high-purity propane | industrial propane | high-purity propane |
| silicon source | silane(SiH$_4$) | silane(SiH$_4$) | silane(SiH$_4$) |
| CVD device | | | |
| deposition of pyrolytic carbon | | FBT CVD device | |
| deposition of silicon | | PE CVD device | |
| Step II (combustion synthesis) | high temperature arc | high temperature reduction furnace | high temperature reduction furnace/ high temperature arc |
| properties of coated layer | | | |
| density (g/cm$^3$) | $\geq 2.6$ | $\geq 2.6$ | $\geq 2.6$ |
| Vickers hardness (GPa) | $\geq 30$ | $\geq 30$ | $\geq 30$ |
| composition | | | |
| β-SiC | $\geq 99\%$ | $\geq 99\%$ | $\geq 99\%$ |
| α-SiC | $\leq 0.5\%$ | $\leq 0.5\%$ | $\leq 0.5\%$ |
| silicon oxide | $\leq 0.3\%$ | $\leq 0.3\%$ | $\leq 0.3\%$ |
| silicon | $\leq 0.2\%$ | $\leq 0.2\%$ | $\leq 0.2\%$ |

EFFECT OF THE INVENTION

Compared with the conventional CVD methods in which the compounds, being decomposed at relatively high temperature(>1570° C.) and producing toxic hydrochloric acid and chlorine gas after reaction such as methylchlorosilane (CH$_3$SiCl$_3$), dimethylchlorosilane ((CH$_3$)$_2$SiCl$_2$) and trimethylchlorosilane ((CH$_3$)$_3$SiCl), are used, the coating method of this invention has an effect that silicon carbide layer can be prepared economically in a short time without influencing properties of nuclear fuel and safely because the compounds, which can be decomposed at low temperature (200~300° C.) and do not produce any toxic by-product, such as silane(SiH$_4$), tetramethylsilane ((CH$_3$)$_4$Si) and hexamethyldisilane(C$_6$H$_{18}$Si$_2$), are used. Moreover, the coating method of this invention can be applied to various types of nuclear fuels either in particle or in pellet form and control and preserve fine crystal structure without phase transition, since the surface of nuclear fuel coated with pyrolytic carbon and silicon is heated only for several seconds by heat source such as laser beam, arc or microwave. Thus, the present invention is excellent method of coating nuclear fuel surface not only for particle type fuel which is used in High Temperature Gas-cooled Reactor (HTGR) but also for pellet type fuel used for Water-cooled Reactors.

Moreover, in this invention, boron carbide or zirconium carbide can be formed by reacting pyrolitic carbon with zirconium, boron, or their compounds instead of silicon or silicon compound; and boride or nitride can be formed by reacting silicon, zirconium, boron, or their compounds with boron or nitrogen instead of pyrolytic carbon.

What is claimed is:

1. Method of coating of nuclear fuel surface at least than two coated layers of carbides, borides or nitrides or their mixtures, comprising the following steps:

depositing or permeating i) elements or compounds that can form carbides, borides or nitrides and ii) a layer of pyrolytic carbon or boron prepared by chemical vapor deposition (CVD) or sputtering in sequence or in reverse sequence, or nitrogen prepared by gas permeation in sequence, on the nuclear fuel surface (Step I); and reacting to the layers formed in step I at a temperature of 1700 to 4000° C. for 1 to 2 seconds with controlling surrounding pressure of $10^{-3}$ to $10^{-2}$ atm by a combustion synthesis using a device selected from the group consisting of a laser beam, arc and microwave as a heat source (Step II).

2. Method of coating of nuclear fuel surface with at least two coated layers of carbides, borides, nitrides or their mixtures according to claim 1, characterized that the step I is carried out at a temperature of 500~1200° C. controlling the surrounding pressure of $10^{-5}$~1 atm.

3. Method of coating of nuclear fuel surface with at least two coated layers of carbides, borides or nitrides or their mixtures according to claim 1, characterized that carbon source of the pyrolytic carbon is selected from the chemical compounds methane ($CH_4$), acetylene($C_2H_2$), ethylene ($C_2H_4$) or propane($C_3H_8$); the boron source is boron (B), boron oxide ($B_2O_3$) or metal-boron compounds; and the nitrogen source is nitrogen gas.

4. Method of coating of nuclear fuel surface with at least two coated layers of carbides, borides or nitrides or their mixtures according to claim 1, characterized that the elements or compounds which can form carbides, borides or nitrides by the reaction between pyrolytic carbon, boron or nitrogen are silicon, zirconium, boron or their compounds.

5. Method of coating of nuclear fuel surface with at least two coated layers of carbides, borides or nitrides or their mixtures according to claim 4, characterized that silicon compound in the coated layer is selected from the chemical compounds silane ($SiH_4$), tetramethylsilane (($CH_3$)$_4$Si) or hexamethyldisilane ($C_6H_{18}Si_2$); the zirconium compound is selected from the chemical compounds zirconium oxide ($ZrO_2$) or zirconium chloride ($ZrCl_4$); and the boron compound is selected from the chemical compounds boron carbide ($B_4C$) and boron nitride (BN).

6. Method of coating a surface of nuclear fuel with at least two coated layers of carbides, borides or nitrides or their mixtures according to claim 1, characterized that shape of nuclear fuel is either in particle or in pellet type.

7. Method of coating of nuclear fuel surface with at least two coated layers of carbides, borides or nitrides and their compounds according to claim 1, characterized that resultant silicon carbide layers include $\beta$-silicon carbide of more than 99%.

8. Method of coating of nuclear fuel surface with at least two coated layers of carbides, borides or their mixtures according to claim 3, characterized that the metal-boron compounds are selected from the group consisting of MoB, $MoB_2$, $ZrB_2$ and mixtures thereof.

9. Method of coating of nuclear fuel surface with at least two coated layers of carbides, borides or nitrides or their mixtures according to claim 1, characterized in that said coating method can be applied to various types of nuclear fuels either in particle or pellet form and control and preserve fine crystal structure without phase transition.

10. Method of coating of nuclear fuel surface with at least two coated layers of carbides, borides or nitrides or their mixtures according to claim 9, characterized in that step II is separately begun only after step I is completed.

11. Method of coating of nuclear fuel surface with at least two coated layers of carbides, borides or nitrides or their mixtures according to claim 1, characterized in that step II is separately begun only after step I is completed.

* * * * *